(12) United States Patent
Reinhold et al.

(10) Patent No.: US 7,112,950 B2
(45) Date of Patent: Sep. 26, 2006

(54) INTEGRATED CIRCUIT FOR USE WITH AN EXTERNAL HALL SENSOR, AND HALL SENSOR MODULE

(75) Inventors: Michael Reinhold, Erlangen (DE); Frank Ohnhaeuser, Erlangen (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/210,016

(22) Filed: Aug. 22, 2005

(65) Prior Publication Data

US 2006/0043969 A1 Mar. 2, 2006

(30) Foreign Application Priority Data

Aug. 31, 2004 (DE) .................. 10 2004 042 077

(51) Int. Cl.
*G01R 33/06* (2006.01)
(52) U.S. Cl. ................. 324/117 H; 324/158.1
(58) Field of Classification Search ..... 324/117 R–117 H, 251–252, 158.1, 73.1, 142; 702/58–62; 338/32 H
See application file for complete search history.

(56) References Cited

U.S. PATENT DOCUMENTS

| | | | |
|---|---|---|---|
| 5,544,089 A | 8/1996 | Hemminger et al. | |
| 6,058,354 A * | 5/2000 | Adame et al. ............... | 702/60 |
| 6,307,338 B1 | 10/2001 | Kuner et al. | |
| 2003/0225539 A1 | 12/2003 | Motz et al. | |

FOREIGN PATENT DOCUMENTS

| | | |
|---|---|---|
| DE | 19842241 A1 | 4/2000 |
| DE | 10154498 A1 | 5/2003 |
| EP | 0434248 B1 | 6/1991 |
| EP | 0454406 B1 | 10/1991 |
| EP | 0525235 B1 | 2/1993 |
| JP | 01126566 | 12/1990 |
| JP | 10272200 | 4/2000 |

OTHER PUBLICATIONS

Kiss et al., Multibit Δ Σ ADC With Mixed-Mode DAC Error Correction, 2001 IEEE, pp. I-280-I-283.

* cited by examiner

*Primary Examiner*—Vinh P. Nguyen
(74) *Attorney, Agent, or Firm*—W. James Brady, III; Frederick J. Telecky, Jr.

(57) ABSTRACT

An integrated circuit for use with an external Hall sensor that permits to at least substantially cancel out the temperature drifts of the Hall sensor, as caused by the temperature drift of the current supplied to the Hall sensor, and the gain of the Sigma-Delta modulator. Specifically, the circuit provides an integrated circuit for use with an external Hall sensor, that has an analog input for application of a Hall voltage from the Hall sensor, a digital data output and a current output for connection to a current input of the Hall sensor. The integrated circuit comprises a Sigma-Delta modulator with an input connected to the analog input and an output connected to the digital data output. An internal reference voltage source is also included in the integrated circuit, and an internal current source is connected to the current output for the Hall sensor. The internal reference voltage source is used as a reference in the current source that determines the amount of current supplied to the Hall sensor, and is also used in the Sigma-Delta modulator as a reference that determines the input voltage range. Since the same reference voltage source is used by the current source for the Hall sensor and by the Sigma-Delta modulator, the temperature drifts of the Hall voltage and the gain of the Sigma-Delta modulator cancel each other. Other benefits are low noise and an excellent common mode rejection.

11 Claims, 1 Drawing Sheet

INTEGRATED CIRCUIT FOR USE WITH AN EXTERNAL HALL SENSOR, AND HALL SENSOR MODULE

CROSS REFERENCE TO RELATED APPLICATIONS

This application claims priority under 35 USC § 119 of German Application Serial No. 10 2004 042 077.7, filed Aug. 31, 2004.

FIELD OF THE INVENTION

The present invention relates to an integrated circuit for use with an external Hall sensor, and to a Hall sensor module.

BACKGROUND OF THE INVENTION

Electric current measurements within electric motor control are mainly based on measurement of a voltage drop across a shunt resistor. For high current applications, however, Hall sensors are used. In both cases, since the voltage to be measured is small and the environment of an electric motor control is typically noisy, the use of a Sigma-Delta modulator is advantageous because of its capability to convert low voltage inputs with high accuracy and low noise. A Sigma-Delta modulator converts an analog input signal into a digital data stream. The principles of Sigma-Delta modulation are described in "CMOS: Mixed-Signal Circuit Design, Chapter 32: Noise Shaping Data Converters" by Russel J. Baker, John Wiley & Sons.

The accuracy of current measurement with a Hall sensor and a Sigma-Delta modulator is affected by several factors. Since the Hall voltage is proportional to the current applied to the Hall sensor, a first factor is the temperature drift of the current supplied to the Hall sensor, such current being in turn dependent on the temperature behavior of a reference voltage source used in the current source that provides the current to the Hall sensor. Another factor is the temperature dependent gain drift of the Sigma-Delta modulator.

SUMMARY OF THE INVENTION

The present invention provides an integrated circuit for use with an external Hall sensor that permits to at least substantially cancel out the temperature drifts of the Hall sensor, as caused by the temperature drift of the current supplied to the Hall sensor, and the gain of the Sigma-Delta modulator. Specifically, the invention provides an integrated circuit for use with an external Hall sensor, that has an analog input for application of a Hall voltage from the Hall sensor, a digital data output and a current output for connection to a current input of the Hall sensor. The integrated circuit comprises a Sigma-Delta modulator with an input connected to the analog input and an output connected to the digital data output. An internal reference voltage source is also included in the integrated circuit, and an internal current source is connected to the current output for the Hall sensor. The internal reference voltage source is used as a reference in the current source that determines the amount of current supplied to the Hall sensor, and is also used in the Sigma-Delta modulator as a reference that determines the input voltage range. As a consequence, since the same reference voltage source is used by the current source for the Hall sensor and by the Sigma-Delta modulator, the temperature drifts of the Hall voltage and the gain of the Sigma-Delta modulator cancel each other. Other benefits are low noise and an excellent common mode rejection.

In another aspect of the invention, a Hall sensor module is provided that comprises a Hall sensor and an integrated circuit, the Hall sensor being external to the integrated circuit. The integrated circuit has an analog input connected to a Hall voltage output of the Hall sensor, a digital data output and a current output connected to a current input of the Hall sensor. The integrated circuit comprises a Sigma-Delta modulator with an input connected to the analog input and an output connected to the digital data output, The integrated circuit also comprises an internal reference voltage source and an internal current source connected to the current output for the Hall sensor. The internal reference voltage source is used as a reference in the current source that determines the amount of current supplied to the Hall sensor, and is also used in the Sigma-Delta modulator as a reference that determines the input voltage range. Again, since the same reference voltage source is used by the current source for the Hall sensor and by the Sigma-Delta modulator, the temperature drifts of the Hall voltage and the gain of the Sigma-Delta modulator cancel each other.

In the preferred embodiment, the module is a hybrid device that contains the Hall sensor and the integrated circuit. Only a few passive components are necessary for a complete Hall module.

Since the Hall sensor usually has a relatively high impedance, the integrated circuit is preferably provided with buffer circuitry between the analog Hall input terminal and the input of a sample-and-hold circuit upstream of the input to the Sigma-Delta modulator.

Another factor that affects the accuracy of current measurement with a Hall sensor and a Sigma-Delta modulator is of course the temperature drift of the Hall sensor sensitivity. In the preferred embodiment, the current supplied to the Hall sensor is adjusted by an external resistor, and the resistor is selected with a temperature behavior that compensates for the temperature behavior of the Hall sensor.

BRIEF DESCRIPTION OF THE DRAWINGS

Further advantages and features will become apparent from the following description with reference to the appending drawings. In the drawings.

DESCRIPTION OF THE DRAWINGS

Figure 1:
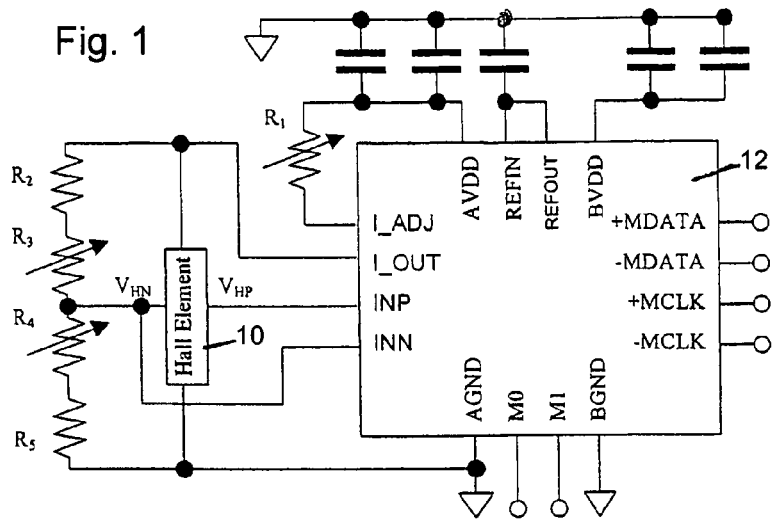
FIG. 1 is a circuit diagram of a Hall sensor module comprising a Hall sensor, an integrated circuit, and several passive components.

In FIG. 1, a Hall sensor module is shown that comprises a Hall element 10 and an integrated circuit 12. The Hall sensor 10 and the integrated circuit 12 may both be contained in a hybrid circuit device. The integrated circuit 12 has a number of connection terminals which are defined as follows:

| Pin Functions | | |
| --- | --- | --- |
| Pin # | Pin Name | Function |
| 1 | I_ADJ | Pin for the hail element current adjustment |
| 2 | I_OUT | Current output for hail element |
| 3 | INP | Positive input pin |

-continued

Pin Functions

| Pin # | Pin Name | Function |
|---|---|---|
| 4 | INN | Negative input pin |
| 5 | AGND | Analog ground pin |
| 6 | M0 | Mode pin |
| 7 | M1 | Mode pin |
| 8 | BGND | Interface ground pin |
| 9 | −MCLK | Inverted clock in-/output |
| 10 | +MCLK | Non inverted clock in-/output |
| 11 | −MDATA | Inverted data output |
| 12 | +MDATA | Non inverted data output |
| 13 | BVDD | Interface supply pin (2.7 . . . 5.5 V) |
| 14 | REFOUT | Reference output pin |
| 15 | REFIN | Reference input pin |
| 16 | AVDD | Analog supply pin |

For a complete module, a few external passive components are required. These include several buffering capacitors and several resistors, as will be explained.

The Hall element 10 has current supply terminals connected to pins I_OUT and AGND of the integrated circuit 12 and Hall voltage outputs $V_{HN}$ and $V_{HP}$ connected to pins INN and INP, respectively, of the integrated circuit 12. Resistor $R_1$ is a variable current adjustment resistor which is connected between pins AVDD and I_ADJ. Series connected resistors $R_2$ to $R_5$ are connected across the current supply terminals of the Hall element 10 and have a center tap connected to output $V_{HN}$ of the Hall element 10. Variable resistors $R_3$ and $R_4$ are provided to permit calibration of the system offset.

Figure 2:
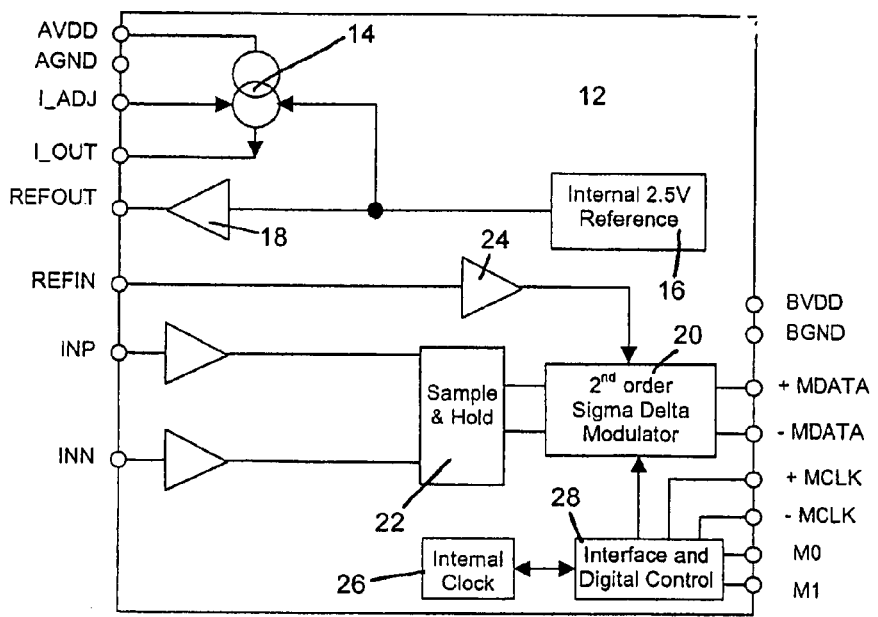
FIG. 2 is a block diagram of the integrated circuit.

With reference to FIG. 2 the integrated circuit 12 includes an internal current source 14 and an internal reference voltage source 16 that provides a reference voltage of e.g. 2.5V. Current source 14 has a supply input connected to pin AVDD, an output connected to pin I_OUT, a first control input connected to pin I_ADJ and a second control input connected to an output of reference voltage source 16. The output of reference voltage source 16 is also connected to pin REFOUT through a buffer amplifier 18.

The integrated circuit 12 also comprises a second order Sigma-Delta modulator 20, details of which will be explained below. The modulator 20 has a differential analog signal input connected to a differential output of a sample-and-hold circuit 22, the differential inputs of which are connected to pins INP and INN, respectively. Differential outputs of the modulator 20 are connected to pins +MDATA and −MDATA, respectively. Modulator 20 also has a reference voltage input connected to pin REFIN through a buffer amplifier 24. The integrated circuit 12 also includes an internal clock generator 26, the output of which is connected to a clock input of modulator 20 through an interface and digital control unit 28.

Figure 3:
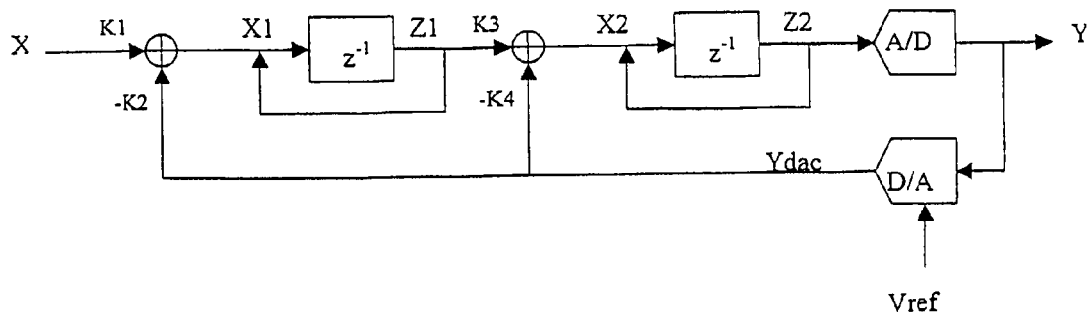
FIG. 3 is a schematic diagram illustrating the concept of a second order Sigma-Delta modulator.

The principals of a second order Sigma-Delta modulator as used here are illustrated in FIG. 3. The topology of the modulator is the following:

The second order modulator has two integrator stages. One integrator stage is built by a summation node and a delay element $z^{-1}$. The stages are working in discrete time steps. The time steps are controlled by the clock frequency.

$X1 = X*K1 - K2*Ydac$ $Z1 = Z1^{-1} + X1$ $X2 = Z1*K3 - K4*Ydac$ $Z2 = Z2^{-1} + X2$ The comparator output is Y=0 if the second integrator output is Z2<0, and Y=1, if Z2>0.

The D/A converter output is +Vref for Y=1 and −Vref for Y=0.

The output bit stream of Y represents the input signal X. For the maximum input signal X the output Y is all the time "1".

$X*K1 = Ydac*K2$

This results in a maximum input range of Xmax=−Xmin=Vref*K2/K1.

For example:

Vref=2.5V, K1/K2=20: Xmax=125 mV

The concept will now be explained with reference to FIG. 1.

In FIG. 1, a hall module is implemented with the integrated circuit (IC). The current that is sourced out of the pin I_OUT can be calculated to $$I_{out} = \frac{x * v_{refout}(T)}{R_1(T)}$$

In this equation, $V_{refout}$ is the voltage at the pin REFOUT that is a function of the temperature. x is design related factor that is set to 0.2 in the IC. The resistor $R_1$ can be chosen to have a certain temperature characteristic.

This current is supplied to the Hall element. The actual Hall voltage $(V_{HP} - V_{HN})$ is directly proportional to the current that is applied to the Hall element:

$$VH = V_{HP} - V_{HN} = B * \frac{x * v_{refout}(T)}{R_1(T)} * a(T) \qquad (1)$$

B is the magnetic field that is sensed by the Hall element. A (T) is a constant factor, which also might include a temperature relationship of the Hall element.

Finally, the hall voltage is converted into a digital bit stream with a sigma delta modulator that is included inside the IC. Usually the hall voltage has a very low voltage range. Gaining up the signal is always causing additional noise, especially common mode noise that is very common in motor control systems. Sigma Delta Converters have the ability to convert low voltage inputs with high accuracy and low noise.

The input voltage range of the sigma delta modulator is proportional to the voltage at the pin REFIN. In case the voltage is shorted to REFOUT, the filtered value $F_{data}$ of the digital output data stream at the pin +/−MDATA is proportional to the input voltage divided by the voltage $v_{refin}$.

$$F_{DATA} = y * \frac{v_{INP} - v_{INN}}{v_{refin}} = y * \frac{v_{INP} - v_{INN}}{v_{refout}} \qquad (2)$$

The bit stream needs to be filtered with an external digital low pass filter to receive a low noise, higher resolution digital output word. The formula above takes into account, that the pins REFIN and REFOUT are shorted. For the IC, the constant factor y is set to 0.05.

$(V_{inp}-V_{inn})$ is equal to $V_H$ in formula (1). Therefore:

$$F_{DATA} = \frac{y}{v_{refout}(T)} * \frac{B * v_{refout}(T)}{R_1(T)} * a(T) = B * \frac{y * x * a(T)}{R_1(T)} \quad (3)$$

As can be seen in formula (3), $R_1$ can be used to adjust the gain of the total Hall module, including the sigma delta modulator. Very important is also, that the reference drift is canceled out ($V_{refout}(T)$). In case that the Hall element itself has also a temperature drift a(t), then a combination of resistor and thermistor can be chosen for $R_1(T)$ to cancel out the temperature dependency.

The absolute accuracy of modulators is usually described with the linearity (integral), the offset, and the gain. While the non-linearity is usually in the range of 0.01–0.02% of the full-scale range (% FSR) and the offset around 0.15–0.31% FSR, the gain error is much higher (1–3% FSR). Also the drift of the gain error is very significant (typically 0.6% FSR, –40° C. to 85° C.).

The above formulas show that the IC increases the system performance by reducing the gain error and the gain error drift. High-end applications calibrate the offset and the gain at room temperature. Therefore the gain error drift is very important.

With the external resistors $R_2$ through $R_5$ the offset of the system can be calibrated also.

A sigma delta modulator is usually implemented in a switched capacitor design. These designs are precharging an input capacitor $C_{samp}$ (also called sampling capacitor) to the input voltage, disconnect the input from the capacitor, and are then processing the charge to/with further capacitors and operational amplifiers. The sampling capacitor is then discharged and reconnected to the input. This cycle is repeated to with every system clock (the IC has an internal clock generator, but can also run with an external clock).

$$C_{samp} = \frac{\Delta Q}{\Delta V} = \frac{I_{in} * \Delta t}{\Delta V} \quad (4)$$

Formula (4) implements that recharging the input capacitor with every clock cycle (cycle time $\Delta t = 1/f_{clk}$) from 0V to the input voltage ($v_{in}-0V=\Delta V$) will require an average current $I_{in}$. In other words, the equivalent input impedance of the modulator is:

$$R_{in} = \frac{V_{in}}{I_{in}} = \frac{1}{f_{clk} * C_{samp}}$$

The limited output impedance $R_H$ (several kOhms) of hall sensors has two effects. First, the output impedance and the equivalent input resistance form a voltage divider $R_H/(R_H*R_{in})$ causing a gain error at the modulators output that can drift with frequency and temperature. Furthermore, if the bandwidth that is formed by the output impedance of the hall element and the input capacitor of the modulator is too slow to recharge the capacitor within the sampling time (typically one half of a clock cycle), then significant non-linearity is implemented.

To overcome these problems and to make the above gain adjustment effective, operational amplifiers are necessary. To minimize the size and the complexity of a Hall module, these operational amplifiers are on chip of the IC.

It is thus understood that the invention provides a combination of a sigma-delta modulator and a current source. With this combination, the absolute accuracy of hall modules can be dramatically improved. Also noise can be suppressed very dramatically, as the differential hall voltage is directly converted to a digital bit stream. Furthermore, with an analog system like the IC as disclosed, the size of the hall module can be reduced.

The invention claimed is:

1. An integrated circuit for use with an external Hall sensor, having:
   an analog input for application of a Hall voltage from the Hall sensor;
   a digital data output and a current output for connection to a current input of the Hall sensor; and
   comprising a Sigma-Delta modulator with an input connected to the analog input and an output connected to the digital data output
   an internal reference voltage source; and
   an internal current source connected to the current output for the Hall sensor,
   wherein the internal reference voltage source is used as a reference in the current source that determines the amount of current supplied to the Hall sensor, and is also used in the Sigma-Delta modulator as a reference that determines the input voltage range.

2. The integrated circuit of claim 1, and comprising a sample-and-hold circuit with an input connected to the analog input and an output connected to the input of the Sigma-Delta modulator.

3. The integrated circuit of claim 2, and comprising buffer circuitry connected between the analog input and the input of the sample-and-hold circuit.

4. The integrated circuit according to claim 1, wherein the internal current source has a current control input connected to a connection terminal for an external current adjustment resistor.

5. The integrated circuit according to claim 1, and comprising a reference voltage output terminal to which an output of the internal reference voltage source is connected and a reference voltage input terminal connected to a reference voltage input of the Sigma-Delta modulator.

6. The integrated circuit according to claim 1, and comprising an internal clock generator for the Sigma-Delta modulator.

7. The integrated circuit according to claim 1, wherein the Sigma-Delta modulator is a second order modulator.

8. A Hall sensor module comprising a Hall sensor and an integrated circuit, the Hall sensor being external to the integrated circuit and the integrated circuit having:
   an analog input connected to a Hall voltage output of the Hall sensor;
   a digital data output; and
   a current output connected to a current input of the Hall sensor;
   the integrated circuit comprising a Sigma-Delta modulator with an input connected to the analog input and an output connected to the digital data output, an internal reference voltage source and an internal current source connected to the current output for the Hall sensor, wherein the internal reference voltage source is used as a reference in the current source that determines the amount of current supplied to the Hall sensor, and is also used in the Sigma-Delta modulator as a reference that determines the input voltage range.

9. The Hall module according to claim 8, comprising an external current adjustment resistor, wherein the internal current source has a current control input connected to a connection terminal of the integrated circuit to which the external current adjustment resistor is connected.

10. The Hall module of claim 9, wherein the external current adjustment resistor is selected with a temperature behavior that compensates for a temperature behavior of the Hall sensor.

11. The Hall module according to claim 8, wherein the Hall sensor and the integrated circuit are contained in a hybrid circuit.

* * * * *